United States Patent
Aga et al.

[11] Patent Number: 6,140,210
[45] Date of Patent: Oct. 31, 2000

[54] METHOD OF FABRICATING AN SOI WAFER AND SOI WAFER FABRICATED THEREBY

[75] Inventors: Hiroji Aga; Kiyoshi Mitani; Yukio Inazuki, all of Gunma-ken, Japan

[73] Assignee: Shin-Etsu Handotai Co., Ltd., Tokyo, Japan

[21] Appl. No.: 09/159,856

[22] Filed: Sep. 24, 1998

[30] Foreign Application Priority Data

Sep. 26, 1997 [JP] Japan ..................................... 9-279878

[51] Int. Cl.[7] .................................................. H01L 21/30
[52] U.S. Cl. .......................... 438/458; 438/455; 438/459; 438/408; 438/407
[58] Field of Search .................................... 438/404, 406, 438/407, 423, 458, 459

[56] References Cited

U.S. PATENT DOCUMENTS 5,882,987  3/1999  Srikrishnan .............................. 438/458

FOREIGN PATENT DOCUMENTS 0 786 801  7/1997  European Pat. Off. .
0 797 248  9/1997  European Pat. Off. .
  5211128  8/1993  Japan .

OTHER PUBLICATIONS

Burel, Michel. "Application of Hydrogen Ion Beams to Silicon On Insulator Material Technology," Nuclear Instruments and Methods in Physics Research B 108 (1996) pp. 313–319.

*Primary Examiner*—Trung Dang
*Attorney, Agent, or Firm*—Hogan & Hartson LLP

[57] ABSTRACT

In a method of fabricating an SOI wafer, an oxide film is formed on the surface of at least one of two silicon wafers; hydrogen ions or rare gas ions are implanted into the upper surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment is performed in order to delaminate a portion of the ion-implanted wafer while the fine bubble layer is used as a delaminating plane, in order to form a thin film to thereby obtain an SOI wafer. In the method, a defect layer at the delaminated surface of the thus-obtained SOI wafer is removed to a depth of 200 nm or more through vapor-phase etching, and then mirror polishing is performed. Therefore, the obtained SOI wafer has an extremely low level of defects and a high thickness uniformity.

8 Claims, 3 Drawing Sheets

6,140,210

METHOD OF FABRICATING AN SOI WAFER AND SOI WAFER FABRICATED THEREBY

BACKGROUND OF THE INVENTION

1. Field of the Invention

The present invention relates to a surface treatment of a wafer having an SOI (silicon on insulator) structure which is fabricated in accordance with a method in which an ion-implanted wafer is bonded to another wafer and a portion of the ion-implanted wafer is delaminated to thereby obtain an SOI wafer (called a smart-cut method).

2. Description of the Related Art

Conventionally, two methods have gained wide notice as methods of fabricating wafers having an SOI structure. One method is a SIMOX (separation by implanted oxygen) method in which oxygen ions are implanted into a silicon monocrystal at a high concentration, and heat treatment is then performed at a high temperature in order to form an oxide layer. The other method is a bonding method in which two mirror-polished silicon wafers are bonded together without use of adhesive, and one of the wafers is subsequently made very thin.

In the SIMOX method, the thickness of an SOI layer that becomes a device active region can be determined and controlled through adjustment of an acceleration voltage at the time of oxygen ion implantation. Therefore, the SIMOX method has an advantage of enabling easy formation of a thin SOI layer having a high uniformity of thickness (hereinafter referred to as "thickness uniformity"). However, the SIMOX method has many problems in relation to the reliability of a buried oxide layer, the crystallinity of the SOI layer, and necessity of heat treatment at a temperature of 1300° C. or higher.

Meanwhile, in the wafer bonding method, an oxide film is formed on at least one of two mirror-polished silicon monocrystalline wafers, which are bonded together without use of adhesive and then subjected to heat treatment (typically, at 1100–1200° C.) in order to strengthen the bonding; subsequently, one of the wafers is subjected to grinding or wet etching such that the wafer becomes a thin film, the surface of which is then mirror-polished to form an SOI layer. Therefore, the reliability of the buried oxide layer is high, and the crystallinity of the SOI layer is good. However, since the thin film is formed by means of mechanical machining, there are limits to the thickness and thickness uniformity of the resultant SOI layer.

In the wafer bonding method, not only silicon wafers are bonded together, but also a silicon wafer may be bonded directly to an insulator wafer of $SiO_2$, $SiC$, $Al_2O_3$, etc., in order to form an SOI layer.

Recently, public attention has been drawn to a new method of fabricating an SOI wafer; a so-called smart-cut method in which an ion-implanted wafer is bonded to another wafer and a portion of the ion-implanted wafer is delaminated to thereby obtain an SOI wafer. In this method, an oxide film is formed on the surface of at least one of two silicon wafers; hydrogen ions or rare gas ions are implanted into the surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment is performed to delaminate a portion of the ion-implanted wafer while the fine bubble layer is used as a delaminating plane, in order to form a thin film; and heat treatment is further performed to firmly bond the thin film and the other wafer, to thereby obtain an SOI wafer (see Japanese Patent Application Laid-Open (kokai) No. 5-211128). Also, in this method, since the surface formed as a result of delamination (hereinafter referred to as a "delaminated surface") has a mirror-like surface, an SOI wafer whose SOI layer has a high thickness uniformity is obtained with relative ease. In the final step of the above-described method, the delaminated surface is subjected directly to mirror polishing for removing a very small amount of stock (70–110 nm), called touch polishing, so as to reduce surface roughness and to remove a defect layer.

However, when an SOI layer that had not yet been subjected to touch polishing was evaluated in accordance with a four-step Secco-etching disclosed by H. Gassel et al. (J. Electrochem. Soc., 140, pp 1713, 1993), the thickness of a crystal defect layer at the SOI layer was found to be about 200 nm. The defect layer is considered to be attributable to deformations and damages generated at the time of hydrogen ion implantation.

Such a defect layer can be eliminated if the amount of stock removed through touch polishing is increased to 200 nm or more. However, in this case, the uniformity of stock removal over the entire surface of a wafer deteriorates, resulting in an increased variation in the thickness of the SOI layer. Especially when the thickness of the SOI layer is small, the increased variation in the thickness causes greatly adverse effects on semiconductor devices, with the result that product value is lost.

SUMMARY OF THE INVENTION

The present invention has been accomplished in light of the above-mentioned problems. An object of the present invention is to provide a method of fabricating an SOI wafer that has a thin SOI layer of good thickness uniformity and high crystallinity, with relative ease and at a relatively low cost, through reliable removal of a crystal defect layer which exists deep in a delaminated surface obtained through a method in which an ion-implanted wafer is bonded to another wafer and a portion of the ion-implanted wafer is delaminated to thereby obtain an SOI wafer.

In order to achieve the above object, the present invention provides a method of fabricating an SOI wafer in which an oxide film is formed on the surface of at least one of two silicon wafers; hydrogen ions or rare gas ions are implanted into the upper surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment is performed in order to delaminate a portion of the ion-implanted wafer, while the fine bubble layer is used as a delaminating plane, in order to form a thin film to thereby obtain an SOI wafer, wherein a defect layer at the delaminated surface of the thus-obtained SOI wafer is removed through vapor-phase etching.

As mentioned above, when an SOI wafer is fabricated according to the method in which an ion-implanted wafer is bonded to another wafer and a portion of the ion-implanted wafer is delaminated to thereby obtain the SOI wafer, a thick crystal defect layer is formed at the delaminated surface of the SOI wafer. Vapor-phase etching is effective in removing such a crystal defect layer. Through vapor-phase etching, the crystal defect layer can be removed while the thickness of an SOI layer is made uniform, even when a large amount of stock is removed.

The present invention also provides a method of fabricating an SOI wafer in which hydrogen ions or rare gas ions are implanted into the upper surface of a silicon wafer in order to form a fine bubble layer (enclosed layer) within the wafer; the ion-implanted wafer is superposed on an insulator wafer such that the ion-implanted surface comes into close contact with the insulator wafer; heat treatment is performed in order to delaminate a portion of the ion-implanted wafer, while the fine bubble layer is used as a delaminating plane, in order to form a thin film to thereby obtain an SOI wafer, wherein a defect layer at the delaminated surface of the thus-obtained SOI wafer is removed through vapor-phase etching.

As is understood from the above, the method in which an ion-implanted wafer is bonded to another wafer and a portion of the ion-implanted wafer is delaminated to thereby obtain an SOI wafer is applicable not only to a case where silicon wafers are bonded together, but also to a case where a silicon wafer is bonded directly to an insulator wafer of $SiO_2$, $SiC$, $Al_2O_3$, etc.

Preferably, the defect layer is removed by the vapor-phase etching to a depth of 200 nm or more.

If the defect layer is removed to a depth of 200 nm or more, the defect layer can be reliably removed. Therefore, it becomes possible to fabricate an SOI wafer whose SOI layer has a uniform thickness.

Preferably, the surface treated by the vapor-phase etching is further treated by mirror polishing.

Although a crystal defect layer is reliably removed through the surface treatment by means of vapor-phase etching, surface roughness called haze may be newly generated during the surface treatment. However, such a surface roughness can be eliminated, as required, through mirror polishing, or more preferably through touch polishing.

The method of the present invention enables removal of a crystal defect layer at the delaminated surface of an SOI wafer fabricated through a method in which an ion-implanted wafer is bonded to another wafer and a portion of the ion-implanted wafer is delaminated to thereby obtain an SOI wafer. Therefore, there can be obtained an SOI wafer which has an SOI layer having a remarkably low level of defects and good thickness uniformity.

As described above, in the present invention, vapor-phase etching is performed in order to remove a crystal defect layer at the surface of the SOI layer of an SOI wafer fabricated through a method in which an ion-implanted wafer is bonded to another wafer and a portion of the ion-implanted wafer is delaminated to thereby obtain an SOI wafer. Therefore, the film thickness of the SOI layer can be made uniform. In addition, when mirror polishing is additionally performed in order to decrease the surface roughness of the SOI layer, it becomes possible to fabricate, with relative ease and at low cost, an SOI wafer having an SOI layer of uniform thickness, decreased surface roughness, a remarkably low level of defects, and high crystallinity.

BRIEF DESCRIPTION OF THE DRAWINGS

FIGS. 2A and 2B are views schematically showing a vapor-phase etching process performed according to the PACE (plasma assisted chemical etching) method, wherein FIG. 2A is a perspective view and FIG. 2B is a sectional view.

DESCRIPTION OF THE PREFERRED EMBODIMENT

An embodiment of the present invention will next be described with reference to the drawings. However, the present invention is not limited thereto.

The following description of the present invention will focus on a case where two silicon wafers are bonded together.

Figure 1:
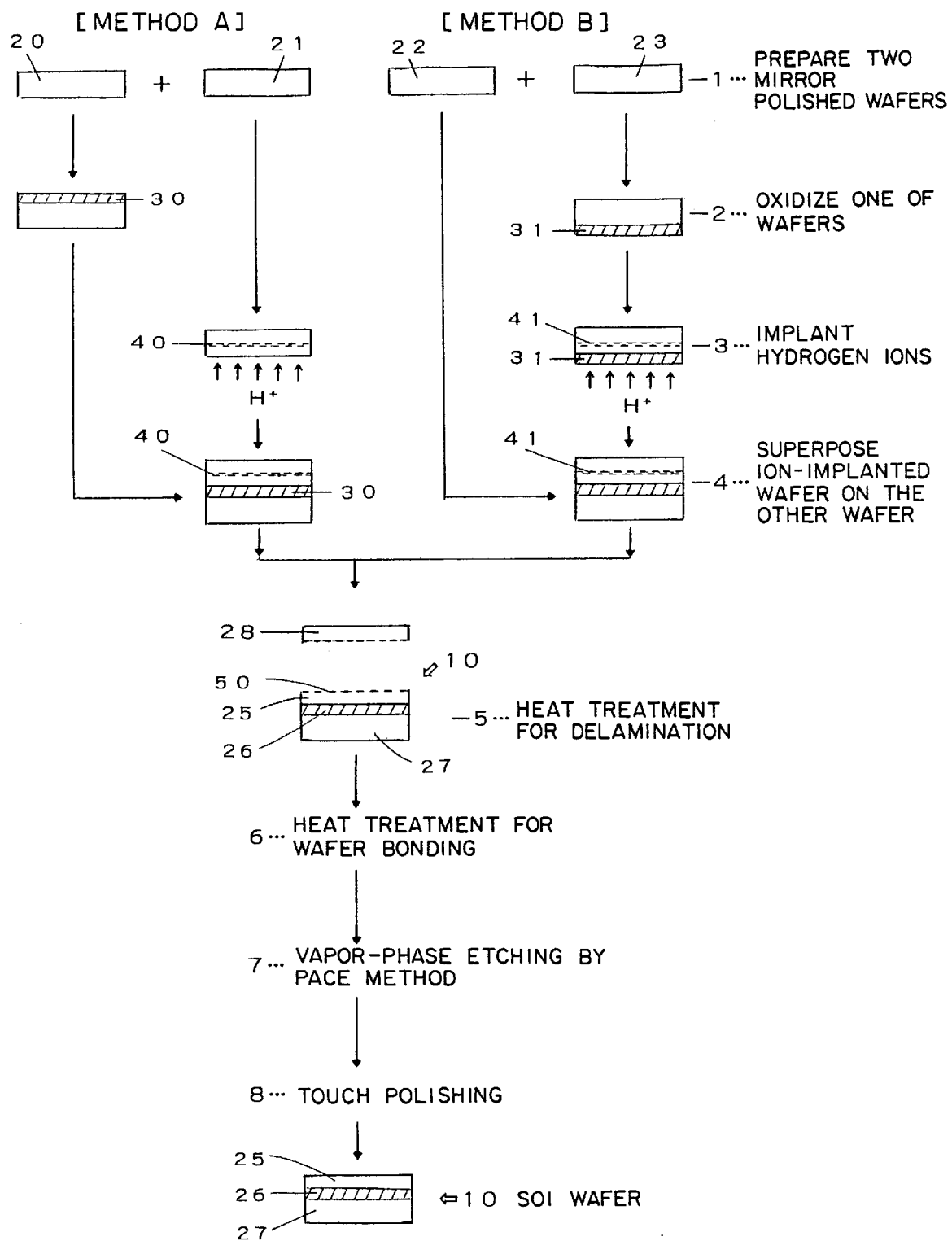
FIG. 1 is a flowchart showing an example of an SOI-wafer fabricating process in which an ion-implanted wafer is bonded to another wafer and a portion of the ion-implanted wafer is delaminated to thereby obtain an SOI wafer.

FIG. 1 is a process chart showing an SOI-wafer fabricating process in which an ion-implanted wafer is bonded to another wafer and a portion of the ion-implanted wafer is delaminated to thereby obtain an SOI wafer and which additionally includes a vapor-phase etching step and a touch polishing step. This process can be performed in two different ways (Method A and Method B) in which the sequences of process steps differ from each other. First, Method A will be described.

In step 1 of Method A, two mirror-polished silicon wafers 20 and 21 suitable for device specifications are prepared.

In step 2 of Method A, at least one of the wafers (wafer 20 in this case) is subjected to thermal oxidation so as to form on the surface thereof an oxide film 30 having a thickness of about 0.1–2.0 $\mu$m.

In step 3 of Method A, hydrogen ions or rare gas ions are implanted into one surface of the other silicon wafer 21 in order to form within the wafer a fine bubble layer (enclosed layer) 40 which extends in parallel to the surface at a position corresponding to the mean depth of ion implantation. The implantation temperature is preferably 25–450° C.

In step 4 of Method A, the ion-implanted wafer 21 is superposed on the other wafer 20 such that the ion-implanted surface comes into close contact with the oxide film 30 of the wafer 20. When the surfaces of the two wafers are brought into contact with each other at ambient temperature in a clean atmosphere, the wafers adhere to each other without use of adhesive or the like.

In step 5 there is performed a heat treatment for delamination in which an upper wafer portion 28 is delaminated from a lower SOI wafer 10 (composed of the SOI layer 25, a buried oxide layer 26, and a base wafer 27) while the enclosed layer 40 is used as a delaminating plane. That is, heat treatment performed at a temperature of about 500° C. or higher in an inert gas atmosphere causes crystal rearrangement and bubble cohesion, to thereby delaminate the upper wafer portion from the lower SOI wafer. The delaminated upper wafer portion 28 is then removed.

In step 6, the wafers which have been caused to come into contact with each other in step 4 above are subjected to heat treatment in order to improve bonding strength to a sufficient level, since the bonding strength imparted in step 4 is too low for a device process. Preferably, this heat treatment is performed in an inert gas atmosphere at 1050–1200° C. for 30 minutes to 2 hours.

Alternatively, the heat treatment for delamination in step 5 and the heat treatment for bonding in step 6 may be successively performed such that the delaminated upper wafer portion 28 is not removed from the lower SOI wafer in step 5. Alternatively, a single heat treatment may be performed for steps 5 and 6.

Figure 2A:
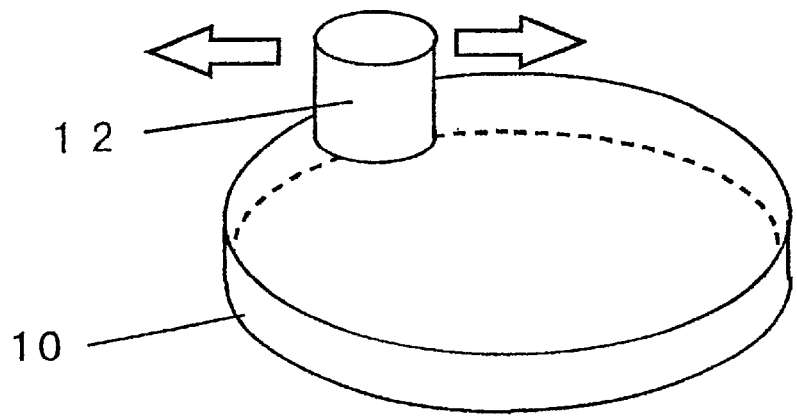
Figure 2B:
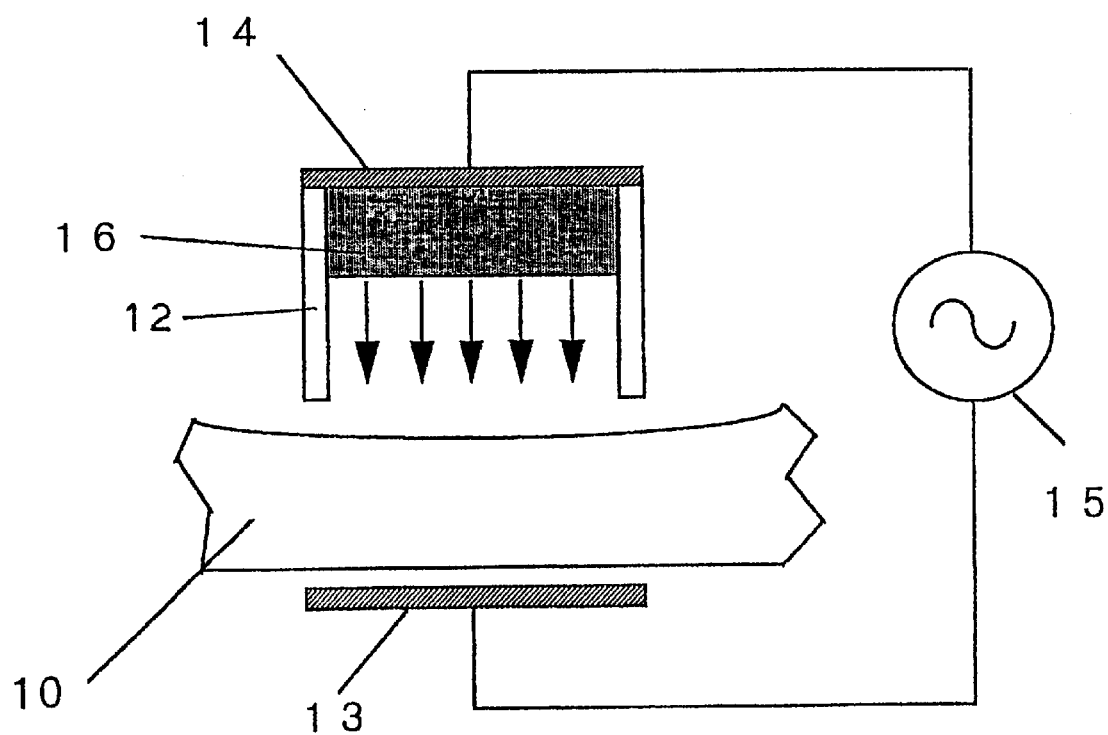

In step 7, through vapor-phase etching, the crystal defect layer at the delaminated surface 50 which is a surface of the SOI layer 25 is removed and the thickness of the SOI layer 25 is made uniform. This step preferably uses the PACE method, in which, as shown in FIGS. 2A and 2B, RF plasma 16 is locally generated within a cavity 12 in order to perform vapor-phase etching.

The sequence of the above-mentioned steps 5-6-7 may be changed to 5-7-6.

The PACE method is one type of dry etching. First, the distribution of thickness of the SOI layer of the SOI wafer 10 is measured. When the cavity 12 is moved over the SOI wafer 10, the traveling speed of the cavity 12 is controlled according to the thickness distribution, so that the time period during which each portion is exposed to the plasma 16 is controlled. As a result, the etching removal amount at the surface is controlled, and thus the thickness of the SOI layer of the SOI wafer 10 is made uniform, while the surface defect layer of the SOI layer is removed. The plasma 16 is locally generated within the cavity 12 through application of an RF voltage from an RF power source 15 to electrodes 13 and 14 disposed below and above the SOI wafer 10. The cavity 12 is supported such that it can freely move over the SOI wafer 10.

The present invention was accomplished through employment of the PACE method in which a vapor-phase etching step is performed for removing a crystal defect layer at the delaminated surface 50 which is a surface of the SOI layer 25, and for making the thickness of the SOI layer 25 uniform, as well as through careful determination of various conditions of the PACE method.

Specifically, vapor phase etching is preferably performed to a depth of 200 nm or more. Thus, surface defects, surface damage, and the like induced by the ion implantation can be reliably removed.

Vapor-phase etching was confirmed to enable removal of a crystal defect layer and improvement of thickness uniformity without impairing the thickness uniformity of the SOI layer, even when a large amount of stock is removed.

Step 8 is a touch polishing step for eliminating surface haze generated during the vapor-phase etching in step 7. The vapor-phase-etched surface is mirror-polished, as required, to a depth of 5–15 nm, preferably about 10 nm.

Through the above-mentioned process, there is fabricated the high-quality SOI wafer 10 which has the SOI layer 25 having high thickness uniformity.

Next will be described a method of fabricating SOI wafer according to Method B. In step 1 of Method B, there are prepared two mirror-polished silicon wafers 22 and 23 suitable for device specifications. In step 2 of Method B, at least one of the wafers (wafer 23 in this case) is subjected to thermal oxidation to form on the surface thereof an oxide film 31 having a thickness of about 0.1–2.0 μm. In step 3 of Method B, hydrogen ions or rare gas ions are implanted into the oxide film 31 of the wafer 23 in order to form within the wafer a fine bubble layer (enclosed layer) 41 which extends in parallel to the surface at a position corresponding to the mean depth of ion implantation. The implantation temperature is preferably 25–450° C. In step 4 of Method B, the ion-implanted wafer 23 is superposed on the silicon wafer 22 such that the ion-implanted surface or oxide film 31 of the wafer 23 comes into contact with the surface of the silicon wafer 22. When the surfaces of the two wafers are brought into contact with each other at ambient temperature in a clean atmosphere, the wafers adhere to each other without use of adhesive or the like. Subsequently, in steps 5 to 8, the same treatment processes as those in Method A are performed, to thereby obtain an SOI wafer which has an SOI layer having uniform thickness without crystal defects.

EXAMPLE

Next, the present invention will be described by way of example. However, the present invention is not limited thereto.

Example

Twenty-eight mirror-polished silicon wafers having a diameter of 150 mm (conductive type: p type; resistivity: 10 Ω.cm) were prepared. These wafers were processed through steps 1 to 6 of Method B shown in FIG. 1 to thereby obtain 14 SOI wafers which have an SOI layer having a thickness of 870 nm. The major process conditions used in the method were as follows:

a) Thickness of buried oxide layer: 400 nm;

b) Conditions of hydrogen implantation: $H^+$ ions, implantation energy: 150 keV, implantation dose: $8 \times 10^{16}/cm^2$;

c) Conditions of heat treatment for delamination: in a $N_2$ gas atmosphere, at 500° C. for 30 minutes; and d) Conditions of heat treatment for bonding: in a $N_2$ gas atmosphere, at 1100° C. for 2 hours.

Figure 3:
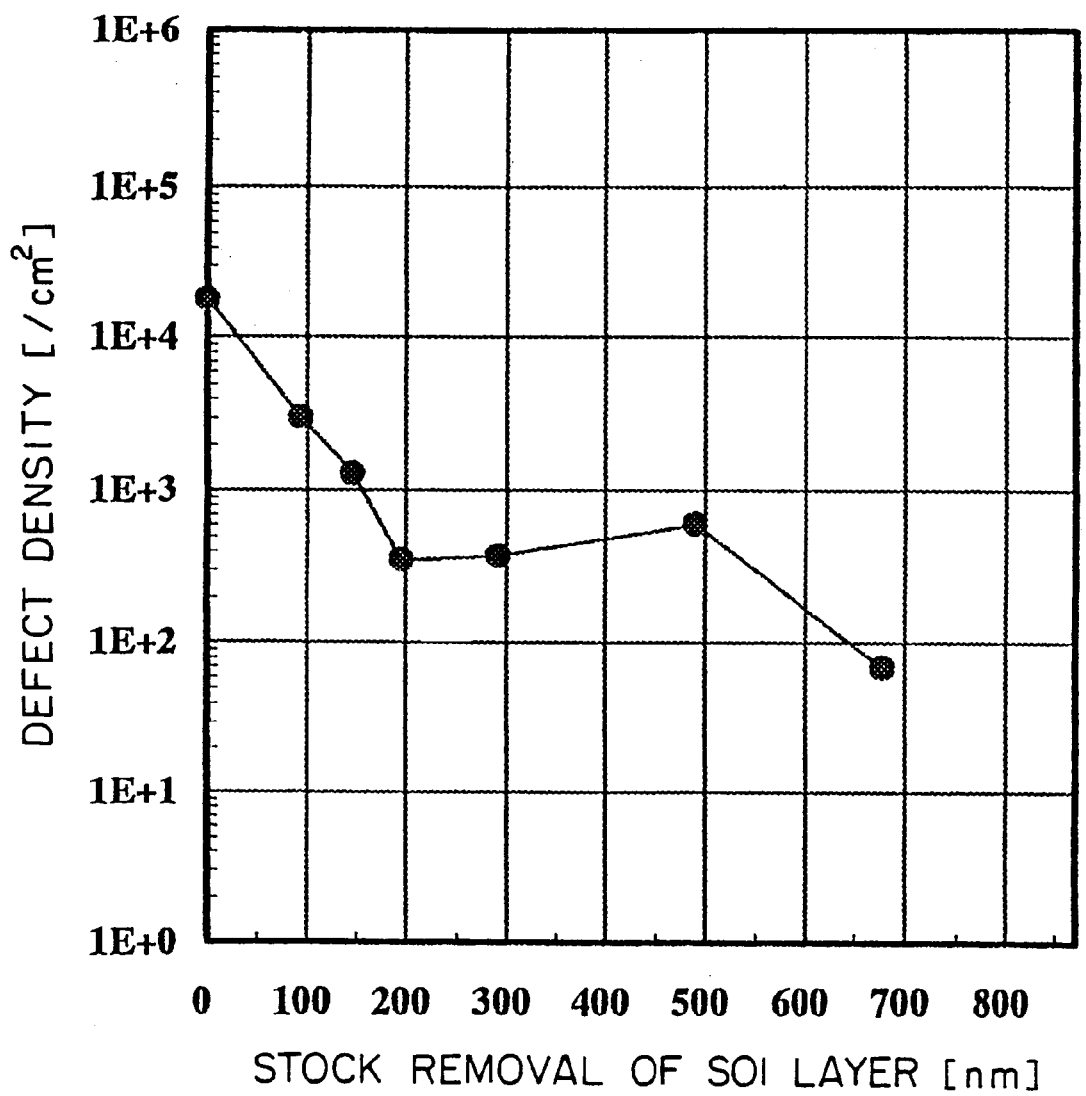
FIG. 3 is a graph showing a relationship between the depth of a crystal defect layer and the density of defect pits at the delaminated surface of an SOI wafer fabricated in accordance with the process shown in FIG. 1.

Of the thus-prepared SOI wafers, 12 SOI wafers were subjected to vapor-phase etching according to the PACE method two pieces at a time such that the SOI layer was etched to a depth of 90 nm, 140 nm, 190 nm, 290 nm, 490 nm, or 680 nm (six kinds). Subsequently, preferential etching was performed in accordance with the four-step Seccoetching in order to measure the density of defect pits (hereinafter referred to as "defect pit density") at the surface of each SOI layer. The results of the measurement are shown in FIG. 3. In FIG. 3, the horizontal axis represents thickness of the stock removal of the SOI layer, and the vertical axis represents defect pit density. FIG. 3 shows the average value of two wafers whose SOI layers were removed to the same depth. For comparison, the two remaining wafers not subjected to vapor-phase etching were evaluated for their defect pit densities in accordance with the four-step Secco-etching method. The results of the evaluation are also shown in FIG. 3.

As is clearly shown in FIG. 3, as the stock removal of the SOI layer increases up to about 200 nm, the defect pit density decreases drastically; however, as the stock removal of the SOI layer further increases from 200 nm, the density does not change substantially and remains at a low level. Therefore, if a defect layer is etched to a depth of at least 200 nm, there is obtained an SOI wafer which has an SOI layer having an extremely low level of defects.

The present invention is not limited to the above-described embodiment. The above-described embodiment is a mere example, and those having the substantially same structure as that described in the appended claims and providing the similar action and effects are included in the scope of the present invention.

For example, the above description of the present invention has focused on the case where two silicon wafers are bonded to obtain an SOI wafer. However, the present invention is not limited to the embodiment. For example, the present invention is applicable to the case where a silicon wafer is bonded to an insulator wafer; an ion-implanted wafer is bonded thereto; and a portion of the ion-implanted wafer is delaminated to thereby obtain an SOI wafer.

What is claimed is:

1. A method of fabricating an SOI wafer, comprising the steps of:

forming an oxide film on the surface of at least one of two silicon wafers;

implanting hydrogen ions or rare gas ions into the upper surface of one of the two silicon wafers in order to form a fine bubble layer (enclosed layer) within the wafer;

superposing the ion-implanted silicon wafer on the other silicon wafer such that the ion-implanted surface comes into close contact with the surface of the other silicon wafer via the oxide film;

performing heat treatment in order to delaminate a portion of the ion-implanted wafer, while the fine bubble layer is used as a delaminating plane, in order to form a thin film to thereby obtain an SOI wafer, wherein a defect layer at the delaminated surface of the thus-obtained SOI wafer is removed through vapor-phase etching.

2. A method of fabricating an SOI wafer, comprising the steps of:

implanting hydrogen ions or rare gas ions into the upper surface of a silicon wafer in order to form a fine bubble layer (enclosed layer) within the wafer;

superposing the ion-implanted wafer on an insulator wafer such that the ion-implanted surface comes into close contact with the insulator wafer; and performing heat treatment in order to delaminate a portion of the ion-implanted wafer, while the fine bubble layer is used as a delaminating plane, in order to form a thin film to thereby obtain an SOI wafer, wherein a defect layer at the delaminated surface of the thus-obtained SOI wafer is removed through vapor-phase etching.

3. A method of fabricating an SOI wafer according to claim 1, wherein the defect layer is removed by the vapor-phase etching to a depth of 200 nm or more.

4. A method of fabricating an SOI wafer according to claim 2, wherein the defect layer is removed by the vapor-phase etching to a depth of 200 nm or more.

5. A method of fabricating an SOI wafer according to claim 1, wherein the surface treated by the vapor-phase etching is further treated by mirror polishing.

6. A method of fabricating an SOI wafer according to claim 2, wherein the surface treated by the vapor-phase etching is further treated by mirror polishing.

7. A method of fabricating an SOI wafer according to claim 3, wherein the surface treated by the vapor-phase etching is further treated by mirror polishing.

8. A method of fabricating an SOI wafer according to claim 4, wherein the surface treated by the vapor-phase etching is further treated by mirror polishing.

* * * * *